United States Patent [19]
Nakasuji

[11] Patent Number: 6,153,340
[45] Date of Patent: Nov. 28, 2000

[54] CHARGED-PARTICLE-BEAM MICROLITHOGRAPHY METHODS AND RETICLES FOR SAME EXHIBITING REDUCED SPACE-CHARGE AND PROXIMITY EFFECTS

[75] Inventor: Mamoru Nakasuji, Yokohama, Japan

[73] Assignee: Nikon Corporation, Tokyo, Japan

[21] Appl. No.: 09/322,204

[22] Filed: May 28, 1999

[30] Foreign Application Priority Data

Jun. 5, 1998 [JP] Japan .................................. 10-172096

[51] Int. Cl.[7] ........................................................ G03F 9/00
[52] U.S. Cl. ................................ 430/5; 430/30; 430/296; 430/942
[58] Field of Search ................................ 430/5, 30, 296, 430/942

[56] References Cited

FOREIGN PATENT DOCUMENTS 90-143516  6/1990  Japan .

OTHER PUBLICATIONS

Kratschmer et al., "Resist Heating Effects in 25 and 50 kV e–beam Lithography on Glass Masks," *J. Vac. Sci. Technol.* 8:1898–1902 (1990).
Liddle et al., "Proximity Effect Correction in Projection Electron Beam Lithography (Scattering with Angular Limitation Projection Electron–Beam Lithography)," *Jpn. J. Appl. Phys.* 34:6672–6678 (1995).
Nakajima et al., "Calculation of a Proximity Resist Heating in Variably Shaped Electron Beam Lithography," *J. Vac. Sci. Technol. 10*:2784–2788 (1992).
Nakajima et al., "New Compensation Method for Avoiding Proximity Resist Heating in Variably Shaped Electron Beam Lithography," *J. Vac. Sci. Technol* 8:1437–1440 (1990).

*Primary Examiner*—Christopher G. Young
*Attorney, Agent, or Firm*—Klarquist Sparkman Campbell Leigh & Whinston, LLP

[57] ABSTRACT

Methods and reticles are provided for performing charged-particle-beam microlithography in which degradations in transfer accuracy arising from the space-charge effect and/or resist heating are reduced. A reticle is divided into multiple exposure units (e.g., subfields) each having at least one pattern feature, and each exposure unit is divided into multiple subunits. Certain features include non-exposed regions having dimensions larger than the resolution limit of the projection-optical system used to project the reticle pattern onto the substrate. Also, the non-exposed regions are desirably smaller than the dimensional limit at which resolution is impossible due to the proximity effect. With stencil reticles, the non-exposed regions are preferably provided at boundaries between complimentary pairs of large-dimension features inside exposure units having different feature densities. The non-exposed regions absorb backscattered electrons from the exposure doses received by surrounding portions of the feature. The dose represented by the backscattered electrons is typically above a threshold value for developing the resist. Such features reduce the feature-density variation of the pattern as defined on the reticle.

16 Claims, 5 Drawing Sheets

CHARGED-PARTICLE-BEAM MICROLITHOGRAPHY METHODS AND RETICLES FOR SAME EXHIBITING REDUCED SPACE-CHARGE AND PROXIMITY EFFECTS

FIELD OF THE INVENTION

This invention pertains to charged-particle-beam microlithography (projection-transfer) methods applicable to the reproduction of ultra-fine patterns (having feature sizes of 0.1 µm or less), as defined on a reticle, onto a suitable substrate as used in the manufacture of integrated circuits, displays, and the like.

BACKGROUND OF THE INVENTION

In charged-particle-beam (CPB) microlithography (especially such microlithography as performed using an electron beam as a representative charged particle beam), proximity effects are an annoying problem. According to conventional methods, certain features in the reticle pattern are configured such that, when projected onto the substrate, the exposed features have interior non-exposed areas having dimensions that are smaller than the resolution limit of the microlithography apparatus. Certain other areas of the reticle pattern, that are not exposed when projected onto the substrate, have interior exposed areas having dimensions that are smaller than the resolution limit of the microlithography apparatus. Such conventional methods reportedly provide a degree of correction of proximity effects, especially in electron-beam microlithography. Jpn. J. Appl. Phys. 34:6672–6678, 1995.

Unfortunately, the above-summarized technique loses effectiveness whenever the feature density is not uniform within an "exposure unit" (i.e., the area of the reticle exposed at any instant of time). I.e., non-uniform space-charge effects can increase to troublesome levels whenever the reticle comprises exposure units having different feature densities. Such space-charge effects cause inconsistent beam defocusing due to differences in the focal position resulting from the space-charge effects in the high-density feature areas versus in the low-density feature areas. Space-charge effects can also introduce concave-lens effects that result in deformation of projected features.

Furthermore, conventional techniques are not effective in countering the so-called resist-heating effect in which resist development differs substantially from pattern areas having relatively small features versus pattern areas having relatively large features.

SUMMARY OF THE INVENTION

This invention addresses the above-summarized problems with the prior art and thus provides a reduction in resist-heating effects and space-charge effects. The invention also alleviates other problems associated with a non-uniform feature density in various regions of the reticle. For example, to reduce space-charge effects, the size of a non-exposed region in a feature is larger than a resolution limit for the projection-optical system used to expose the feature, but smaller than the resolution limit for the projection-optical system imposed by the proximity effect.

According to a first aspect of the invention, methods are provided for projection-transferring a pattern, defined by a reticle, onto a substrate by charged-particle-beam (CPB) microlithography. According to a representative embodiment of such a method, a pattern to be transferred onto the sensitive substrate is defined by a reticle. The pattern comprises multiple features and the reticle is divided into multiple exposure units (e.g., subfields). A portion of the reticle is illuminated with an illumination beam of charged particles (e.g., electron beam) to produce a patterned beam of charged particles (e.g., electrons) passing through the illuminated portion of the reticle. The patterned beam is projected through a projection-optical system onto the sensitive substrate to form an image on the substrate of the illuminated portion of the reticle. The reticle is configured such that, if an exposed feature of the pattern is larger than an predetermined threshold size, then the feature comprises a non-exposed region that is larger than a resolution limit of the projection-optical system but smaller than a resolution limit for the projection-optical system due to a proximity effect.

In the foregoing method, the reticle can be, for example, a stencil reticle or a membrane ("scattering") reticle. The exposure units of the reticle can be illuminated, for example, in a step-and-repeat manner, step-and-scan, or continuous-scanning manner.

According to another aspect of the invention, methods are provided for projection-transferring a pattern, defined by a reticle, onto a substrate by CPB (e.g., electron beam) microlithography. According to a representative embodiment of such a method, a pattern to be transferred onto a sensitive substrate is defined by a reticle. The pattern comprises multiple features and the reticle comprises multiple exposure units. Successive exposure units of the reticle are illuminated with an illumination beam of charged particles to produce successive respective patterned beams. The patterned beams are projected through a projection-optical system onto the sensitive substrate to form corresponding images on the substrate of the illuminated exposure units of the reticle. As the exposure units are projected onto the substrate, the images of the exposure units as projected onto the substrate are situated relative to each other so as to be contiguously "stitched" together.

The feature-density variation within an exposure unit is detected. This can be performed after completing data processing for reticle delineation. For example, each exposure unit is divided into multiple (e.g., 2–9) subunits. The feature density of each subunit in each exposure unit (or at least in selected subunits of selected exposure units) of the reticle is determined. These data can be stored for recall and use in subsequent calculations. The feature-density variation can then be calculated from these individual feature-density data.

Exposure units are identified that have a region or area (e.g., subunit) in which the feature density is larger than a predetermined threshold level (an exemplary threshold is a feature density that is twice the feature density of the exposure unit). If a feature in such a region or area is longer than a predetermined size, then the feature is provided with at least one non-exposed region having a dimension smaller than a resolution limit of the projection-optical system. (An exemplary predetermined size limit is a quarter of the radius of backscattered electrons from the substrate.) The non-exposed region can have dimensions that are larger than the resolution limit of the projection-optical system but smaller than a dimensional limit at which resolution becomes impossible due to a proximity effect. The proximity-effect resolution limit can be determined from a resist simulation. The resolution limit is the minimum feature size that will not be defined in the particular resist after exposure and development of the resist. An exemplary resolution limit is two times the beam-edge resolution of the projection-optical system.

As noted above, the reticle can be a membrane reticle or stencil reticle. If the latter, then the method can further include the step of dividing the exposure unit (including the feature having the non-exposed region) into first and second complementary exposure units which can be on the same or on separate reticles. The feature having the non-exposed region is divided between the first and second complementary exposure units. The non-exposed region is desirably situated on a boundary between the first and second complementary exposure units as exposed onto the substrate. If the non-exposed region were not placed in such a location, then problems can arise with the "donut effect" due to which the non-exposed region is not definable on the reticle.

According to another aspect of the invention, methods are provided for projection-transferring a pattern, defined by a reticle, onto a substrate by CPB microlithography. According to a representative embodiment, the pattern to be transferred onto a sensitive substrate is defined by a reticle. The pattern comprises multiple features and the reticle comprises multiple exposure units that are exposable in, e.g., a step-and-repeat, step-and-scan, or continuous scanning manner. Successive exposure units of the reticle are illuminated with an illumination beam of charged particles (e.g., electrons) to produce a patterned beam of charged particles passing successively through the illuminated exposure units of the reticle. The patterned beam is projected through a projection-optical system onto the sensitive substrate to form images on the substrate of the illuminated exposure units of the reticle. Meanwhile the images of the exposure units as projected onto the substrate are stitched together.

The feature-density variations within exposure units are detected so as to identify subunits having high feature density and subunits having low feature density. Determination of the feature-density variation can be performed as summarized above. An example of a high feature density in a subunit of an exposure unit is twice the average feature density in the corresponding exposure unit, and an example of a low feature density in a subunit of an exposure unit is half the average feature density in the corresponding exposure unit. Within each exposure unit, in each of the subunits with high feature density and in each of the subunits with low feature density, the total length of all features having the minimal linewidth (i.e., the critical dimension in the particular pattern defined on the reticle) is determined. The subunit (of all subunits of the exposure unit) having the greatest total length of critical-dimension features is identified. A focal condition (e.g., lens excitation current) is determined for the subunit having the greatest total length of critical-dimension features, and that focal condition is used to expose all the subunits of the respective exposure unit.

According to another aspect of the invention, reticles are provided that define a pattern to be transferred to a substrate by CPB microlithography using a projection-optical system. According to a representative embodiment, such a reticle comprises multiple exposure units each defining a respective portion of the pattern, wherein each exposure unit defines at least one pattern feature. Within an exposure unit, if a feature as exposed on the substrate is larger than a pre-specified dimension, then the feature is provided with an interior non-exposed portion having a dimension that is larger than a resolution limit of the projection-optical system and smaller than a dimensional limit at which resolution by the projection-optical system is impossible due to a proximity effect.

In an alternative embodiment of such a reticle, the exposed feature is larger than a pre-specified dimension and is situated in a high-feature-density region of the exposure unit. The feature has a non-exposed region having dimensions smaller than a resolution limit of the projection-optical system.

According to yet another embodiment, the reticle comprises multiple exposure units each defining a respective portion of the pattern for exposure onto the substrate by, e.g., step-and-repeat, step-and-scan, or continuous-scanning exposure. Each of the exposure units includes multiple features. Exposure units are identified that include a feature that, when exposed, is longer than a pre-specified dimension (e.g., 10 $\mu$m) and is situated in a high-feature-density area of the exposure unit (e.g., an area having a feature density that is larger than the overall feature density in the respective exposure unit). Such a feature is provided with a non-exposed region having dimensions larger than a resolution limit of the projection-optical system but smaller than a dimensional limit at which resolution is impossible due to a proximity effect.

The foregoing and additional features and advantages of the invention will be more readily apparent from the following detailed description, which proceeds with reference to the accompanying drawings.

DETAILED DESCRIPTION

Figure 1A:
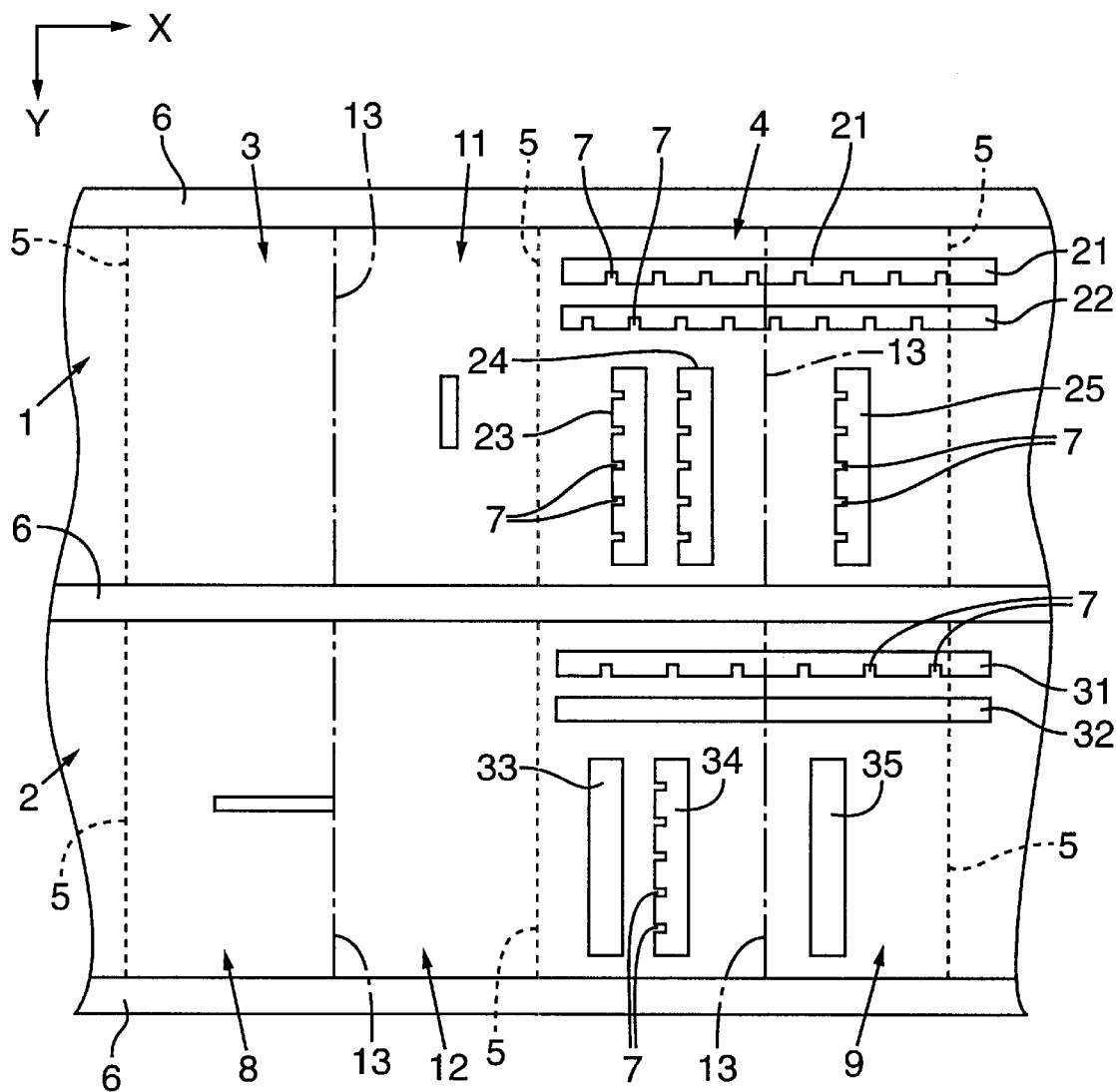
FIG. 1(A) depicts a feature configuration in a stencil reticle, and a method of pattern transfer using such a reticle, according to a first example embodiment of the invention. The stencil reticle includes complementary exposure units.

In general, the present invention provides, inter alia, charged-particle-beam (CPB) projection-transfer methods (e.g., such methods utilizing an electron beam) in which the pattern to be transferred onto a sensitive substrate is defined by a reticle. Because the entire reticle pattern cannot be transferred accurately to the substrate in a single exposure, the reticle is "divided" (or "segmented") into multiple "exposure units" (e.g., subfields) that are individually exposed in a, e.g., "step-and-repeat," "step-and-scan," or continuous scanning manner. I.e., the entire reticle pattern is transferred by sequentially "illuminating" successive regions (i.e., the exposure units) of the reticle using the electron beam (serving as an "illumination beam"). The beam passing through the illuminated regions of the reticle automatically becomes a "patterned beam" that is projected onto the substrate, using a projection-optical system, to form images of the respective illuminated regions on the substrate surface. To facilitate imprinting of the images, the exposed surface of the substrate is "sensitized" by application of a suitable "resist."

The reticle pattern comprises multiple "features." A "feature" is a portion of the pattern that defines, for example, a fundamental portion of the circuit to be formed on the substrate. Such fundamental portions are exemplified by transistor gates and the like. Each exposure unit can contain one or more features.

According to the invention, if a feature is longer than a predetermined threshold feature size (e.g., 5 $\mu$m), then the interior of the feature is provided with one or more "non-exposed" regions. The threshold feature size can be determined from resist simulations in which evaluations are made of the minimal feature size that is imprintable (after exposure and development) in a layer of the subject resist. A representative range of threshold feature sizes is greater than 3 $\mu$m. A "non-exposed" region of a feature prevents direct exposure, by the patterned beam, of the corresponding region of the feature as projected onto the substrate. Each such non-exposed region desirably has dimensions that are larger than the dimensional limits of resolution (determined from resist simulations) of the CPB projection-optical system, but smaller than the dimensional limits at which feature resolution becomes impossible due to proximity effects. An exemplary range of such limits is smaller than 200 nm at the wafer and smaller than 800 nm at the reticle.

When a feature containing a non-exposed region is projected onto the substrate, the non-exposed region is indirectly exposed by absorbing backscattered electrons from the CPB dose received by surrounding exposed regions of the feature. As a result, and as desired, the "non-exposed" region actually receives a CPB dose higher than a threshold dose necessary to expose the resist at that location.

Typically, only relatively large features of the reticle pattern are provided with non-exposed regions. In any event, providing at least certain features with such non-exposed regions allows the variation in feature density over the entire pattern from one exposure unit to the next and from one region (subunit) to be reduced compared to a pattern having features not including such non-exposed regions. As a result, according to the invention, the uniformity of the feature density over the entire reticle is improved compared to conventional reticles. In addition, since the beam current is also decreased inside such features as projected, space-charge effects are reduced overall.

Since the dimensions of the non-patterned regions are larger than the resolution of the projection-optical system, the reticle can be produced easily without needing to greatly increase the number of features. In addition, the average dose is decreased for features that include non-exposed regions. Consequently, exposure-related temperature increases in the resist are decreased.

It will be understood that reticles for charged-particle-beam (CPB) microlithography can be of two types. In a "stencil reticle," the pattern features are defined by corresponding voids in a reticle membrane. In a "membrane" (or "scattering") reticle, features are defined by a corresponding pattern of regions, on a reticle membrane (e.g., silicon), that greatly scatter incident charged particles. Methods according to the present invention can be employed with either type of reticle.

With respect to a stencil reticle, methods according to the invention can be utilized whenever a feature in an exposure unit is divided into two complementary features divided between two exposure units on either the same or different reticles. If a feature divided in such a manner also includes a non-exposed region, according to the invention, the feature is desirably divided between the exposure units such that the non-exposed region is located at a boundary between the two complementary features as projected onto the substrate.

Over the entire reticle, the feature density can vary considerably from exposure unit to exposure unit and from region to region (e.g., subunit to subunit) within individual exposure units. The feature density in each exposure unit can be determined for example from data concerning the pattern on the reticle. In a similar manner, areas (e.g., subunits) within the exposure unit can be evaluated. In such an evaluation of an exposure unit, the total length of all features having the critical dimension of the pattern is determined in each subunit in which the feature density is high (i.e., above a predetermined threshold for either the exposure unit or other unit area of the reticle) and in each subunit in which the feature density is low (i.e., below a predetermined threshold for either the exposure unit or other unit area of the reticle). The focal condition for the exposure unit can be adjusted to the subunit in the exposure unit in which the total length of critical-dimension features is greatest.

Figure 3:
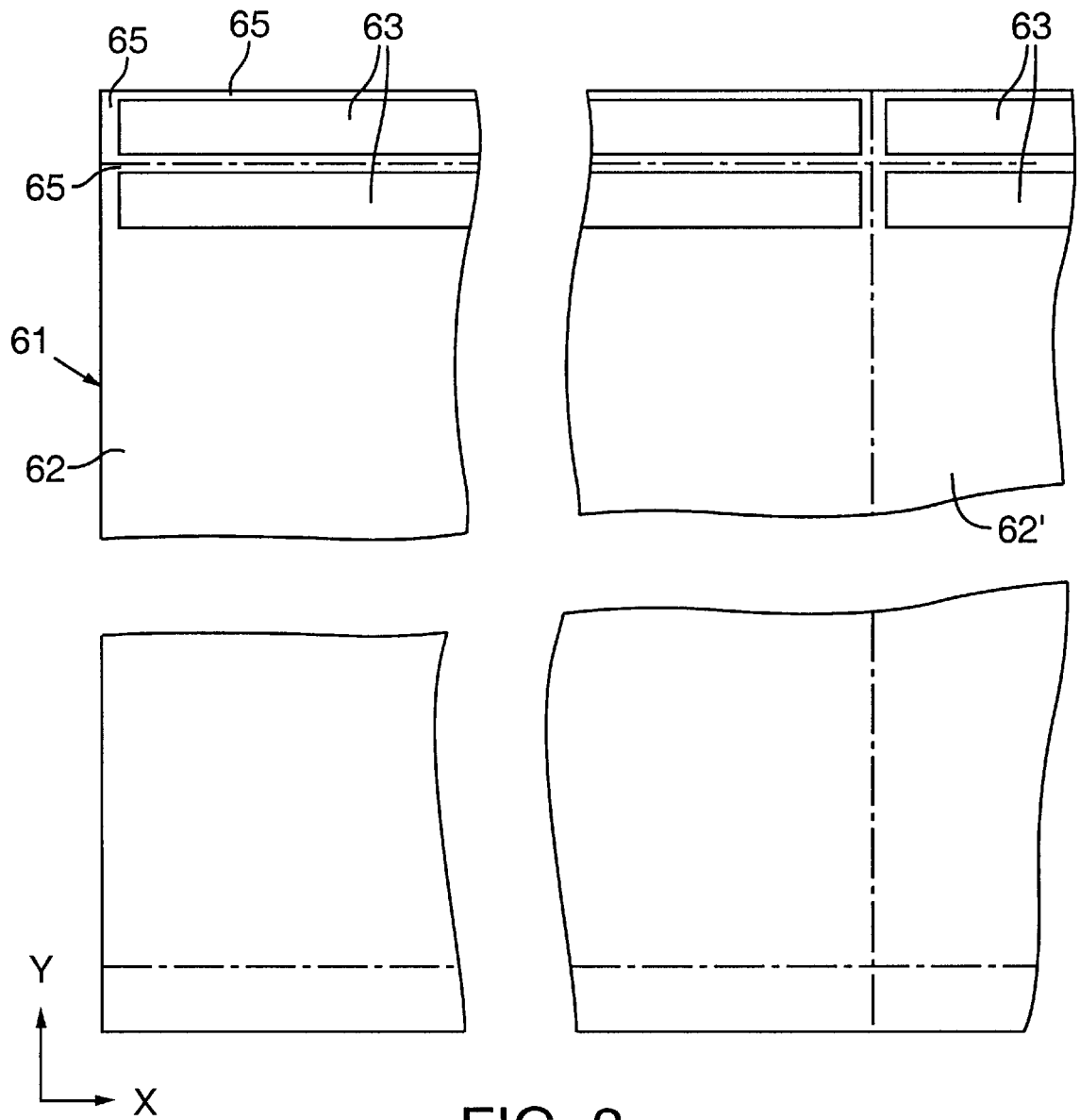
FIG. 3 depicts an example of the circumstances of semiconductor device pattern division in a reticle as used in a divided transfer-type electron-beam transfer method.

An exemplary manner of subdividing a reticle as used in "divided" projection-transfer using an electron beam is shown in FIG. 3. Such a reticle can be used in, e.g., manufacturing a semiconductor device. In FIG. 3, the vertical direction (in the figure) is the Y direction and the horizontal direction (in the figure) is the X direction. The Y direction extends orthogonally across a "scan strip" 63 and the X direction extends parallel to the scan strip 63.

In FIG. 3, the outline of the overall pattern 61 for a "chip" on the substrate is rectangular. The chip pattern 61 is divided into multiple scan strips 63 extending longitudinally in the X direction in the figure. By way of example, each scan strip 63 on the reticle is 1 mm wide and 20 to 40 mm long.

Several tens to several hundred scan strips 63 are typically arrayed in the Y direction (in the figure) of the chip pattern 61, and a row of such scan strips is called a "stripe" 62. By way of example, the reticle pattern 61 comprises three to seven stripes 62 extending in the X direction in the figure.

Surrounding each scan strip 63 is an approximately 0.1-mm wide boundary region 65. On an actual reticle, each boundary region 65 is relatively thick (e.g., approximately 1 mm thick) along its longitudinal midline (compared to the approximately 2.0-$\mu$m thickness of a field on which the reticle pattern is formed). Thus, the boundary regions 65 can serve to provide the reticle with considerable rigidity. During projectiontransfer of the pattern from the reticle to the substrate, the non-exposed regions 65 are not transferred to the substrate. Rather, as exposed, the pattern portions defined by each scan strip 63 are contiguously "stitched" to their adjoining scan strips to form the entire chip pattern on the substrate.

The most common demagnification ratios for CPB projection-exposure apparatus are ¼ and ⅕. If the size of one chip on a substrate is (for the case of a 4-Gigabit DRAM) about 27 mm in the X direction and about 44 mm in the Y direction, then the overall size of the chip pattern on the reticle, including non-patterned areas, is approximately 120 to 150 mm in the X direction and 150 to 250 mm in the Y direction.

During projection-transfer of the chip pattern 61 in FIG. 3, the reticle is illuminated by a scanning illumination beam. The scanning motion of the illumination beam is achieved by deflecting the beam in the X direction along each scan strip 63. To such end, an upstream "illumination optical system" (not shown) includes lenses, a scanning deflector, and a shaping aperture. The shaping aperture shapes the transverse profile of the illumination beam (e.g., rectangular shape that is slightly wider than the width of a scan strip 63).

The area of the scan strip 63 (or any other portion of the reticle) illuminated by the illumination beam at any single instant is termed the "exposure unit" on the reticle. As the illumination beam passes through the exposure unit, the beam (now termed a "patterned beam") acquires an ability to form an image of the illuminated exposure unit. The patterned beam propagating from the reticle to the substrate is demagnified and deflected as required by a "projection-optical system" to cause the patterned beam to form an image of the exposure unit at a desired location on the substrate. If the scan strip 63 includes a non-patterned region not intended to be projected onto the substrate, the illumination beam can be appropriately shifted in a step-and-repeat manner as the illumination beam scans the scan strip 63. In any event, as the illumination beam scans a scan strip 63, appropriate beam controls such as dynamic focus adjustment and the like are simultaneously applied as required to achieve low-aberration projection imaging of the scan strip 63.

Meanwhile, the reticle (mounted on a reticle stage) and the substrate (mounted on a substrate stage) are either continuously or intermittently shifted, as required, in a synchronous manner in the Y direction so as to advance exposure to the next scan strip 63. Since the image normally is inverted by the projection-optical system, the reticle and substrate stages move in opposite directions. If the stages are moved continuously during scanning of each scan strip 63, then the scan strip 63 on the reticle is moved in the Y direction while the location on the substrate to which the scan strip is being projected also is moved in the Y direction. Despite such movement of the stages in the Y direction, the beam strikes the correct position by appropriately deflecting the illumination beam and the patterned beam.

After exposure of one stripe 62 is completed, exposure shifts to the next stripe 62. During such shifting, exposure is temporarily stopped while the reticle stage and substrate stage move in the X direction to position the next adjacent stripe 62' on the reticle and the corresponding exposure region of the substrate near the optical axis of the projection-optical system.

A general configuration of a projection-exposure system capable of performing the steps described above is shown in FIG. 4. The FIG.-4 apparatus is also capable of performing the projection-transfer methods according to the invention. An electron gun 101 (or other suitable CPB source) is situated at the extreme upstream end of the optical system. The electron gun 101 emits an electron beam in the downward direction in the figure along an optical axis A. The "illumination-optical system," comprising first and second condenser lenses 102, 103, is situated below the electron gun 101. The electron beam passes through the condenser lenses 102, 103 and forms an image of the electron gun 101 at a first crossover C.O.1 flanked by a blanking aperture 107. A blanking deflector 104, situated directly above the second condenser lens 103, shifts the crossover C.O.1 to a position at which the illumination beam is blocked by the blanking aperture 107 whenever it is desired not to illuminate the reticle 109 with the illumination beam. The current density of the illumination beam irradiating the reticle 109 can be varied by actuating the two condenser lenses 102, 103 in the manner of a zoom lens.

A shaping aperture 105 is provided downstream of the second condenser lens 103. The shaping aperture 105 limits the area and extent of the transverse profile of the illumination beam to a desired area and profile for illuminating an exposure unit of the reticle. An image of the shaping aperture 105 is formed on the reticle 109 by an irradiation lens 108.

A scanning deflector (not shown, but used for deflecting the illumination beam in the X direction) is disposed at the same "height" (i.e., position along the optical axis A) as the blanking aperture 107. The scanning deflector sequentially scans the illumination beam in the X direction in FIG. 4 (i.e., the horizontal direction in the figure) so as to expose all the exposure units in one scan strip 63 (FIG. 3). The irradiation lens 108 is disposed downstream of the blanking aperture 107. The irradiation lens 108 collimates the illumination beam for illumination of the reticle 109, thereby causing the illumination beam to form an image of the shaping aperture 105 on the reticle 109. In the FIG.-4 configuration, the image of the shaping aperture 105 is demagnified and formed on the reticle 109. Such a "reduction" system is used so as to alleviate thermally induced changes in the illumination beam incident to the shaping aperture 105.

Figure 4:
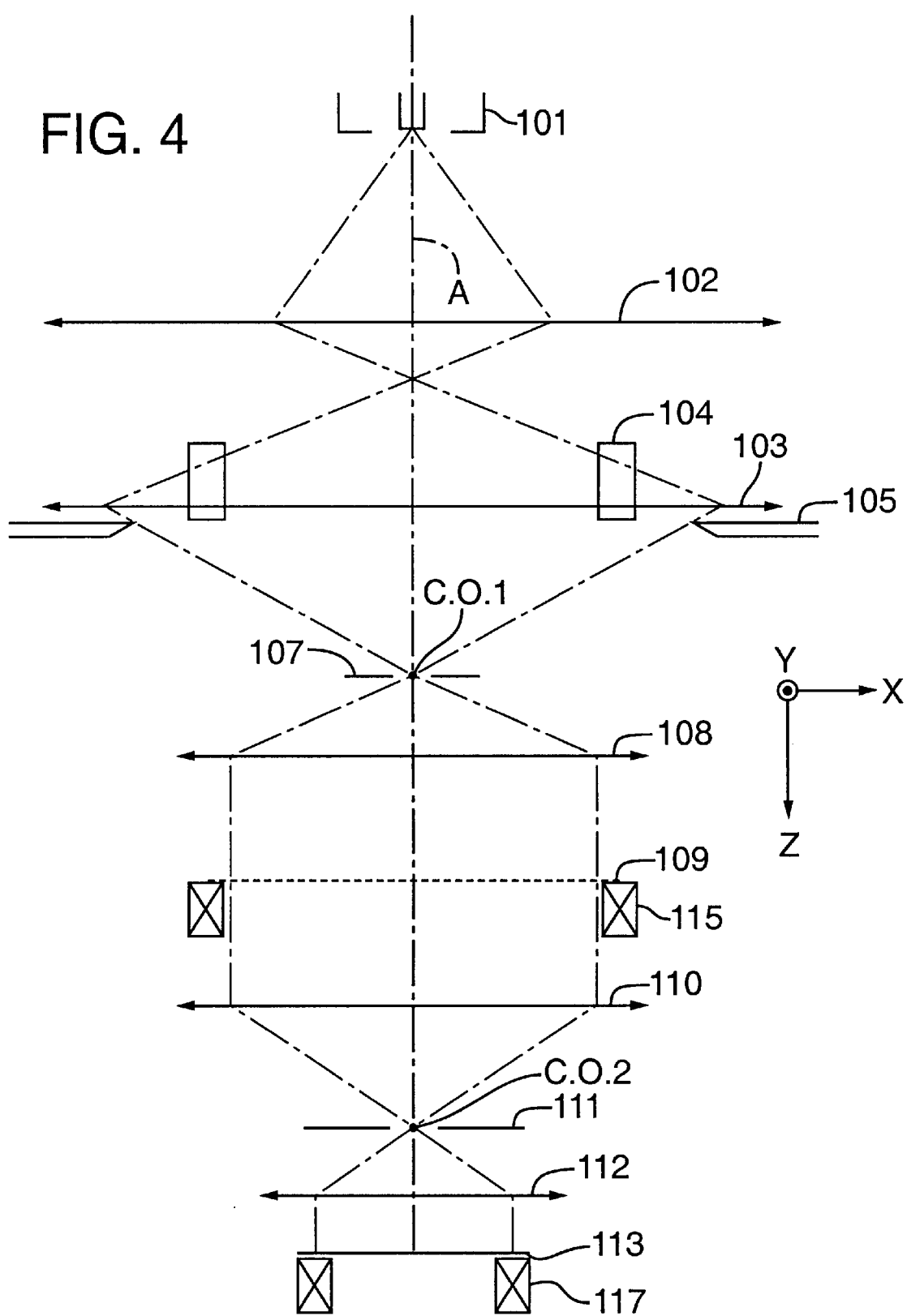
FIG. 4 shows an imaging relationship in the overall optical system of a demagnifying electron-beam projection-transfer apparatus as used to perform methods according to the invention.

Whereas only one exposure unit on the optical axis of the reticle 109 is shown in FIG. 4, it will be understood that the reticle actually extends much farther in the X and Y directions (that are perpendicular to the optical axis A). The reticle 109 thus has many scan strips and stripes, as described above in connection with FIG. 3. As a scan strip is sequentially illuminated, the electron beam is deflected by the scanning deflector, as described above.

In addition, the reticle 109 is mounted on a reticle stage 115 movable in the XY directions. The substrate (e.g., a semiconductor wafer) 113, having a layer of a CPB-sensitive material ("resist") on its upstream-facing surface, is mounted on a substrate stage 117 movable in the XY directions. By synchronously scanning the reticle stage 115 and the substrate stage 117 in mutually opposing directions along the Y direction, the various scan strips 63 within a stripe 62 of the chip pattern in FIG. 3 are continuously exposed. Accurate position-measurement systems comprising laser interferometers are installed on each stage 115, 117. The various scan strips 63 as projected are accurately "stitched" together on the substrate 113 by separate alignment means and deflector adjustments.

First and second projection lenses 110, 112 and a deflector (not shown) are situated below the reticle 109. Thus, the electron beam (now termed a "patterned beam" because it has passed through an exposure unit on the reticle 109) is demagnified ("reduced") by passing through the projection lenses 110, 112 and deflected so as to form an image of the illuminated region of the reticle 109 at a desired location on the substrate 113. As noted above, an appropriate resist is applied to the upstream-facing surface of the substrate 113; by applying a dose of the electron beam to the resist, a demagnified image of the illuminated portion of the reticle pattern is imprinted on the resist. A second crossover C.O.2 is formed at an axial location at which the distance between the reticle 109 and the substrate 113 is sub-divided by the demagnification ratio of the projection lenses 110, 112. A contrast aperture 111 is situated at the second crossover C.O.2. The contrast aperture 111 blocks portions of the beam that are scattered by the reticle 109 so that such portions do not reach the substrate 113.

Figure 1B:
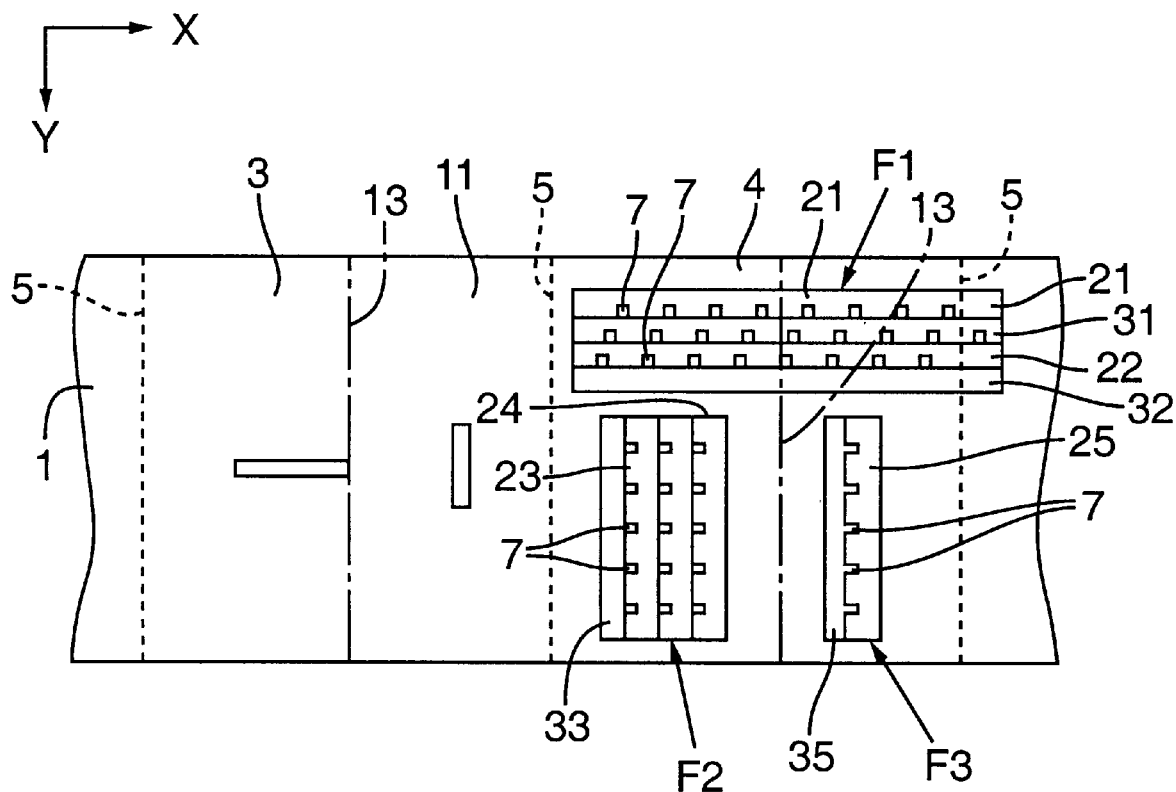
FIG. 1(B) depicts representative profiles of features as imprinted on the reticle from exposure of complementary exposure units as shown in FIG. 1(A).

A representative embodiment of a method for transferring a pattern (defined by a stencil reticle) to a substrate is now explained, referring to FIGS. 1(A)–1(B). FIG. 1(A) shows a reticle of which portions are divided into complementary regions. That is, instead of each scan strip of the reticle defining a separate respective portion of the reticle pattern, certain portions of the reticle pattern are divided between two complementary scan strips. For example, two complementary scan strips 1, 2 are shown that correspond to the same portion of the reticle pattern, wherein the scan strip 1 is complementary to the scan strip 2. A linear non-patterned region 6 extends between rows of scan strips.

In FIG. 1(A), the dotted lines 5 extending vertically in each of the scan strips indicate imaginary boundaries of exposure units within each scan strip (i.e., the distance between adjacent dotted lines 5 indicates the width of an exposure unit). The dot-dashed lines 13 represent boundaries between areas (subunits) of corresponding exposure units having a high feature density and areas having a low feature density. For example, in the figure, each scan strip 1, 2 is shown with three boundaries 5 and two exposure units (exposure units 3, 4 in the scan strip 1, and exposure units 8, 9 in the scan strip 2). Each exposure unit 3, 4, 8, 9 represents a region of the reticle that will be illuminated at a given respective instant by the illumination beam.

When exposed onto the substrate, the features defined in each scan strip 1, 2 are superposed on the same exposure region on the substrate. In this example, the feature density in the exposure units 3 and 8 is comparatively low, while the feature density in the exposure units 4 and 9 is comparatively high. However, the difference in the local feature density in each of the exposure units 3, 4, 8, and 9 is not as great.

Continuing further with FIG. 1(A), the exposure unit 4 includes two horizontal-line features 21, 22 (each having an exemplary linewidth of 2.5 $\mu$m). The complementary exposure unit 9 includes the two horizontal-line features 31, 32 (having an exemplary linewidth of 2.5 and 2.05 $\mu$m, respectively). Images of the features 21, 22 as exposed onto the substrate are situated adjacent images of the features 31, 32 to form a single large feature F1 (FIG. 1(B)). I.e., when exposed onto the substrate, the lower edge of the feature 21 coincides with the upper edge of the feature 31, the lower edge of the feature 31 coincides with the upper edge of the feature 22, and the lower edge of the feature 21 coincides with the upper edge of the feature 32. As can be seen in FIG. 1(B), the edges of the features 21, 22, 31 that are joined together include non-exposed regions 7. Other edges of these features and the edges of the feature 32 do not.

Similarly, the two vertical-line features 23, 24 (each having an exemplary linewidth of 2.5 $\mu$m) in the left-hand subunit of the exposure unit 4 are exposed on the substrate adjacent the two vertical-line features 33, 34 (having exemplary linewidths of 2.5 and 2.05 $\mu$m, respectively) in the left-hand subunit of the exposure unit 9. Thus, a single wide vertical-line feature F2 is formed on the substrate (FIG. 1(B)). As can be seen in FIG. 1(B), the edges of the features 23, 24, 34 that are joined together include non-exposed regions 7. Other edges of these features and the edges of the feature 33 of these features do not.

Further similarly, the vertical-line feature 25 in the right-hand subunit of the exposure unit 4 is exposed on the substrate together with the vertical-line feature 35 in the right-hand subunit of the exposure unit 9. Thus, a single wide vertical-line feature F3 is formed on the substrate (FIG. 1(B)). As can be seen in FIG. 1(B), the edge of the feature 25 that is joined with the feature 35 has non-exposed regions 7. Other edges of the feature 25 and the edges of the feature 35 do not.

During exposure, the illumination beam is scanned in the X direction within one of the scan strips 1, 2. As the illumination beam is scanned in such a manner, the exposure unit being exposed at successive instances of time shifts from the left to the right in FIG. 1(A). For example, at a first instant in time, the exposure unit 3 is being exposed. The exposure unit 3 includes a left-hand subunit to the left of the line 13 and a right-hand subunit to the right of the line 13. At a second and subsequent instant in time, exposure has shifted to an exposure unit represented by the subunit 11 situated to the left of the line 5 and the subunit 4 to the right of the line 5, and so on. Now, within the subunit 11 (and within the complementary subunit 12), the feature density is low; in contrast, within the subunit 4 (and within its complementary subunit), the feature density is high. Thus, certain exposure units have a marked difference in feature density within them. Under such conditions, it is desirable to reduce the exposure inside subunits that include certain large or dense features. In the example shown in FIG. 1(A), multiple 150-nm square (as exposed onto the substrate) non-exposed regions 7 are provided at complimentary boundaries (dividing lines) of such features. If, by way of example, the resolution limit of the projection-optical system used for exposure is 70 nm, then the 150-nm square non-exposed patterns 7 are resolvable when exposed using such a projection-optical system. However, since the non-exposed regions 7 are situated within much larger features as exposed (e.g., the features F1, F2, F3 in FIG. 1(B)), the non-exposed regions 7 will not be resolved under such conditions on the substrate. This is because the resist in regions on the substrate corresponding to the locations of the non-exposed regions 7 in such large features F1, F2, F3 will be exposed by backscattered electrons from regions of the transferred features that do receive a direct dose of electrons.

The multiple non-exposed regions 7 desirably represent about 1 to 10 percent of the surface area of the corresponding exposed feature. With respect to the feature-density difference, the larger the percentage the better. However, increasing the percentage too much increases the number of non-exposed regions. Hence the desired range of 1–10 percent. Also, the dimensions of the non-exposed regions are desirably such that the non-exposed regions will absorb backscattered electrons from the directly exposed regions of the corresponding feature (such as from around peripheral portions of the corresponding feature). Consequently, the overall exposure dose received by the corresponding feature as exposed onto the substrate is decreased in proportion to the area of the feature occupied by the non-exposed regions 7. From the decrease in dose applied to such features, the feature-density variation in each exposure unit is correspondingly decreased, thereby making the feature density from one subunit to another more uniform. In addition, since the beam current is also correspondingly decreased within each subunit, space-charge effects are reduced.

Furthermore, the dimensions of the non-exposed regions of the features desirably are greater than the resolution limit of the projection-optical system. This allows reticles to be produced more easily without having to substantially increase the number of features. In addition, because the CPB dose is decreased to half for each complementary feature that includes the non-exposed regions, temperature increases in the resist are reduced by about half, which reduces resist-heating effects. Hence, transfer of larger features from the reticle to the substrate is achieved under exposure conditions that are the same as for smaller features.

Figure 2A:
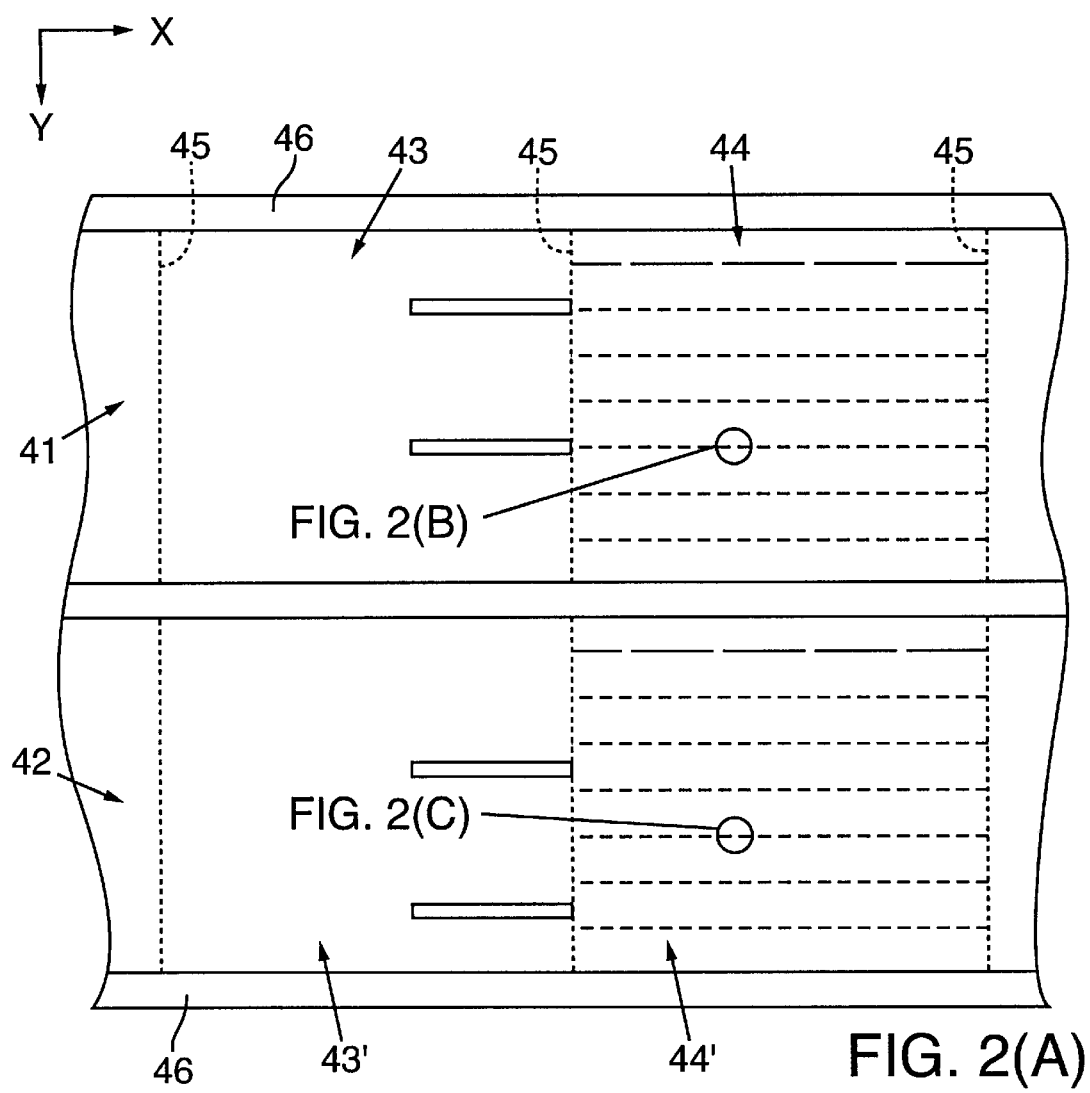
FIG. 2 depicts a reticle, and an electron-beam transfer method using such a reticle, according to a second example embodiment of the invention.
Figure 2B:
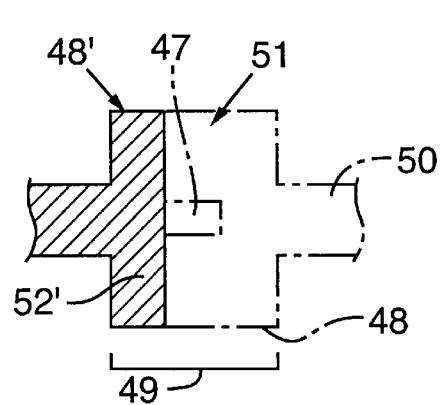
Figure 2C:
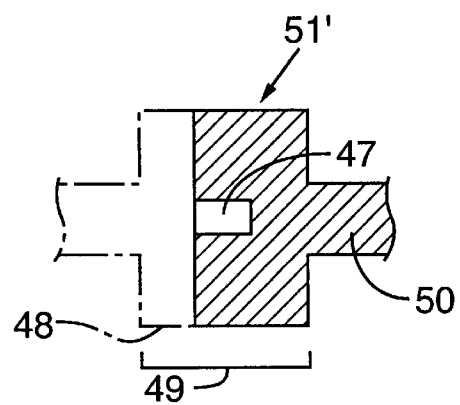

FIG. 2(A) depicts a reticle and projection-transfer method using such a reticle, according to a second example embodiment. In FIG. 2, two scan strips 41, 42 are shown having temporary exposure-unit boundaries 45. The scan strip 41 defines exposure units 43, 44, and the scan strip defines exposure units 43', 44'. Each of the exposure units 43 has a relatively low feature density; each of the exposure units 44 has a higher feature density with features 48, 48', respectively, shown enlarged in FIGS. 2(B) and 2(C). The features 48 and 48' are complimentary to each other. When the features 48, 48' are transferred to the substrate, multiple square-shaped regions 49 are formed (each measuring 3 $\mu$m×3 $\mu$m in this example) with interconnecting bands 50 (having a linewidth of 1 $\mu$m in this example) that tie the regions 49 together.

Features having a profile like that shown by the non-hatched area on the right side in FIG. 2(B) and on the left side in FIG. 2(C) are defined in the scan strip 41, while features having a profile like that shown by the hatching on the left side in FIG. 2(B) and on the right side in FIG. 2(C) are defined in the scan strip 42. Each feature 48, 48' has a large end 51, 51', respectively, and a small end 52, 52', respectively. A small rectangular non-exposed region 47 (measuring 0.09 $\mu$m×1.0 $\mu$m in this example) is provided in each large end 51, 51', so as to be situated, after exposure, at the center of each square-shaped region 49, 49' formed by the abutment of small ends 52, 52', with respective small ends 51, 51'.

The pattern in this example is fine ("fine" means smaller than twice the critical dimension of the pattern) and has a high feature density ("high" means greater than 25% of the overall feature density). Hence, the non-exposed region 47 is smaller (at 0.09 $\mu$m in this example) than the resolution limit (1.0 $\mu$m in this example) of the electron-beam projection-optical system used in this example. (If the non-exposed regions 47 were larger than the resolution limit, then the non-exposed regions 47 would be resolved upon exposure, which is not desired.) The threshold feature density in this example is 150% of the mean feature density of the respective exposure unit, and the pre-determined feature size is 50 times the critical dimension.

Furthermore, there are no ultra-fine features in the exposure unit 43, but there are many ultra-fine features in the exposure unit 44. Hence, the focal parameters of the projection-optical system, when scanning both exposure units 43 and 44, can be matched to what is required for the exposure unit 44, i.e., the exposure unit having the highest beam current. (The focal parameters as a function of beam current were measured experimentally.)

Therefore, this invention provides CPB projection-transfer methods, and reticles for use with such methods, that avoid decreases in pattern-transfer accuracy that would otherwise arise from space-charge effects and/or resist heating.

Whereas the invention has been described in connection with multiple embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for projection-transferring a pattern, defined by a reticle, onto a substrate by charged-particle-beam microlithography, the method comprising:
    (a) defining a pattern, to be transferred onto a sensitive substrate, by a reticle, the pattern comprising multiple features and the reticle comprising multiple exposure units;
    (b) illuminating a portion of the reticle with an illumination beam of charged particles to produce a patterned beam of charged particles passing through the illuminated portion of the reticle; and
    (c) projecting the patterned beam through a projection-optical system onto the sensitive substrate to form an image on the substrate of the illuminated portion of the reticle;
    (d) wherein the reticle is configured such that, if an exposed feature of the pattern is larger than a predetermined threshold size, the feature comprises a non-exposed region having a dimension that is larger than a resolution limit of the projection-optical system but smaller than a resolution limit for the projection-optical system imposed by a proximity effect.

2. The method of claim 1, wherein step (d) comprises dividing the feature into first and second complementary feature portions.

3. The method of claim 2, wherein the non-exposed region is situated on an edge of at least one of the first and second feature portions, wherein the first and second feature portions are stitched together along the edge when exposed onto the sensitive substrate.

4. The method of claim 1, wherein the reticle is a stencil reticle.

5. The method of claim 1, wherein the reticle is a membrane reticle.

6. The method of claim 1, wherein step (b) comprises illuminating the reticle in a step-and-repeat manner.

7. The method of claim 1, wherein step (b) comprises illuminating the reticle in a continuous-scanning manner.

8. A method for projection-transferring a pattern, defined by a reticle, onto a substrate by charged-particle-beam microlithography, the method comprising:
    (a) defining a pattern, to be transferred onto a sensitive substrate, by a reticle, the pattern comprising multiple features and the reticle comprising multiple exposure units;
    (b) detecting a feature-density variation within individual exposure units and, in exposure units having a feature density larger than a predetermined threshold level, if a feature is larger than a predetermined size, then providing the feature with at least one non-exposed region having a dimension smaller than a resolution limit of the projection-optical system to be used to transfer the pattern onto the substrate;
    (c) illuminating successive exposure units of the reticle with an illumination beam of charged particles to produce a patterned beam of charged particles passing successively through the illuminated exposure units of the reticle; and
    (d) projecting the patterned beam through the projection-optical system onto the sensitive substrate to form images on the substrate of the illuminated exposure units of the reticle while stitching together the images of the exposure units as projected onto the substrate.

9. The method of claim 8, wherein the non-exposed region has dimensions that are larger than the resolution limit of the projection-optical system but smaller than a dimensional limit at which resolution becomes impossible due to a proximity effect.

10. The method of claim 8, wherein the feature-density variation is detected by dividing each exposure unit into multiple subunits, and determining the feature density in each subunit according to data concerning the pattern.

11. The method of claim 10, wherein each exposure unit is divided into no more than 9 subunits.

12. The method of claim 8, further comprising the step of dividing the exposure unit including the feature having the non-exposed region into first and second complementary exposure units, wherein the feature having the non-exposed region is divided into first and second complementary feature portions situated in first and second complementary exposure units, respectively, and the non-exposed region is situated on a boundary between the first and second complementary feature portions as exposed onto the substrate.

13. A method for projection-transferring a pattern, defined by a reticle, onto a substrate by charged-particle-beam microlithography, the method comprising:

(a) defining a pattern, to be transferred onto a sensitive substrate, by a reticle, the pattern comprising multiple features and the reticle comprising multiple exposure units that are exposable in a step-and-repeat manner or in a continuous scanning manner;

(b) detecting a feature-density variation within at least selected exposure units to identify high-feature-density areas and low-feature-density areas of the respective exposure units;

(c) within each selected exposure unit, in each of selected areas having a high feature density and in each of selected areas having a low feature density, detecting a total length of features having a minimal linewidth in each area; and (d) in each of the selected exposure units, determining a focal condition appropriate for the respective area having a maximum total length of features having the minimal linewidth;

(e) illuminating successive exposure units of the reticle with an illumination beam of charged particles to produce a patterned beam of charged particles passing successively through the illuminated exposure units of the reticle, each exposure unit being illuminated with the respective focal condition determined in step (d); and;

(f) projecting the patterned beam through a projection-optical system onto the sensitive substrate to form images on the substrate of the illuminated exposure units of the reticle while stitching together the images of the exposure units as projected onto the substrate.

14. A reticle defining a pattern to be transferred to a substrate by charged-particle-beam microlithography using a projection-optical system, the reticle comprising:

(a) multiple exposure units each defining a respective portion of the pattern, each exposure unit defining at least one pattern feature; and (b) within an exposure unit, if a feature as exposed on the substrate is larger than a pre-specified dimension, then providing the feature with an interior non-exposed portion having a dimension that is larger than a resolution limit of the projection-optical system and smaller than a dimensional limit at which resolution by the projection-optical system is impossible due to a proximity effect.

15. A reticle defining a pattern to be transferred to a substrate by charged-particle-beam microlithography using a projection-optical system, the reticle comprising:

(a) multiple exposure units each defining a respective portion of the pattern for exposure onto the substrate by step-and-repeat exposure or continuous-scanning exposure;

(b) the exposure units each comprising multiple features;

(c) in exposure units that include a feature that, when exposed, is larger than a pre-specified dimension and is situated in a high-feature-density region of the exposure unit, the feature having a non-exposed region having dimensions smaller than a resolution limit of the projection-optical system.

16. A reticle defining a pattern to be transferred to a substrate by charged-particle-beam microlithography using a projection-optical system, the reticle comprising:

(a) multiple exposure units each defining a respective portion of the pattern for exposure onto the substrate by step-and-repeat exposure or continuous-scanning exposure;

(b) the exposure units each comprising multiple features;

(c) in exposure units that include a feature that, when exposed, is larger than a pre-specified dimension and is situated in a high-feature-density region of the exposure unit, the feature having a non-exposed region having dimensions larger than a resolution limit of the projection-optical system but smaller than a dimensional limit at which resolution is impossible due to a proximity effect.

* * * * *

UNITED STATES PATENT AND TRADEMARK OFFICE
CERTIFICATE OF CORRECTION

PATENT NO. : 6,153,340
DATED : November 28, 2000
INVENTOR(S) : Mamoru Nakasuji

It is certified that error appears in the above-identified patent and that said Letters Patent is hereby corrected as shown below:

Column 1,
Line 12, change "μm" to -- μm --.

Column 2,
Line 12, change "an" to -- a --.

Column 4,
Line 11, change "μm" to -- μm --.

Column 5,
Line 6, change "μm" to -- μm --.
Line 13, change "μm" to -- μm --.

Column 6,
Line 40, change "μm" to -- μm --.
Line 43, change "projectiontransfer" to -- projection-transfer --.

Column 9,
Line 24, change "μm" to -- μm --.
Line 26, change "μm" to -- μm --.
Line 39, change "μm" to -- μm --.
Line 43, change "μm" to -- μm --.

Column 10,
Line 12, change "complimentary" to -- complementary --.
Line 66, change "complimentary" to -- complementary --.

Column 11,
Line 2, two places, change "μm" to -- μm --.
Line 3, change "μm" to -- μm --.
Line 13, two places, change "μm" to -- μm --.
Line 22, change "μm" to -- μm --.
Line 23, change "μm" to -- μm --.

UNITED STATES PATENT AND TRADEMARK OFFICE
CERTIFICATE OF CORRECTION

PATENT NO. : 6,153,340
DATED : November 28, 2000
INVENTOR(S) : Mamoru Nakasuji

It is certified that error appears in the above-identified patent and that said Letters Patent is hereby corrected as shown below:

Column 12,
Line 2, change "an predetermined" to -- a predetermined --.

Column 13,
Line 17, change "area; and" to -- area; --.
Line 29, change "and;" to -- and --.

Signed and Sealed this

Seventh Day of May, 2002

Attest:

JAMES E. ROGAN
*Attesting Officer*        *Director of the United States Patent and Trademark Office*